United States Patent
Sant'Angelo et al.

(10) Patent No.: US 6,248,860 B1
(45) Date of Patent: Jun. 19, 2001

(54) FUNCTIONALIZED POLY(ALKYLENE CARBONATE), AND USE THEREOF

(75) Inventors: Joseph G. Sant'Angelo, New Castle County; Xiaomao Chen, Newark, both of DE (US); Vincent D. McGinnis, Delaware, OH (US)

(73) Assignee: Empower Materials Inc., Newark, DE (US)

( * ) Notice: Subject to any disclaimer, the term of this patent is extended or adjusted under 35 U.S.C. 154(b) by 0 days.

(21) Appl. No.: 09/446,780

(22) Filed: Dec. 27, 1999

Related U.S. Application Data

(60) Provisional application No. 60/051,267, filed on Jun. 30, 1997.

(51) Int. Cl.$^7$ .................................................. C08G 63/04
(52) U.S. Cl. ......................................... 528/196; 528/198
(58) Field of Search ...................................... 528/196, 198

(56) References Cited

U.S. PATENT DOCUMENTS

| | | | |
|---|---|---|---|
| 3,248,414 | | 4/1966 | Stevens ................. 528/196 |
| 3,248,415 | | 4/1966 | Stevens ................. 528/196 |
| 3,248,416 | | 4/1966 | Stevens ................. 528/196 |
| 4,066,630 | * | 1/1978 | Dixon et al. ........... 528/370 |
| 4,104,264 | * | 8/1978 | Dixon et al. ........... 528/370 |
| 4,145,525 | * | 3/1979 | Dixon et al. ........... 528/404 |
| 4,301,231 | | 11/1981 | Atarashi et al. ........ 430/287 |
| 4,303,759 | * | 12/1981 | Dixon et al. ........... 525/408 |

FOREIGN PATENT DOCUMENTS 570908A   11/1993  (EP) .

* cited by examiner

Primary Examiner—Terressa M. Boykin

(57) ABSTRACT

Disclosed are cross-linkable and cross-linked, functionalized poly(alkylene carbonates), processes for making them, and their use in photoresist compositions.

15 Claims, No Drawings

FUNCTIONALIZED POLY(ALKYLENE CARBONATE), AND USE THEREOF

CROSS-REFERENCE TO RELATED APPLICATIONS

Provisional, U.S. Patent Application Serial No. 60/051,267 filed Jun. 30, 1997, the priority of which is claimed.

BACKGROUND OF THE INVENTION

1. Field of the Invention

This invention resides in the chemical arts. In one aspect, it relates to synthetic resins, particularly poly(alkylene carbonates). In another aspect, it relates to photolithography.

2. Description of Related Art

Poly(alkylene carbonates) are polymers in which the basic monomeric unit is represented by the generic skeletal formula:

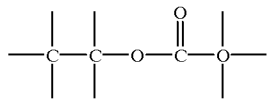

Depending on the molecular weight of the polymers, their state ranges from normally viscous liquid to normally solid. The expressions "nomrally liquid" and "normally solid" as used in this specification mean liquid and solid at 20–25° C. One process for making them comprises the catalytic copolymerization of carbon dioxide and epoxides such as, for example, ethylene oxide, propylene oxide, cyclohexene oxide, and the like. In the commercial practice of this process, the product is a normally solid polymer in which the polymer chains are composed predominately of alkylene carbonate units. However, the chains can have as much as 20 mole % alkylene ether units. These units are represented by the generic skeletal formula:

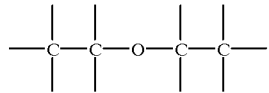

However, it is preferred that the chains have 8 mole % or less of such units. Also, in such process the desired, normally solid polymer product usually is separated from the polymerization reaction mixture, and washed with aqueous media to remove catalyst and by-products.

One utility of these commercial products in general is as thermally decomposable, sacrificial binders in the manufacture of metal and ceramic articles. In this regard, at temperatures above 300° C., but substantially less than 550° C., poly(alkylene carbonates) in general have the property of decomposing and burning cleanly and completely with minimal ash residue.

The U.S. Pat. No. 3,900,424 to Inoue et al. discloses the copolymerization of epoxy compounds with carbon dioxide to form normally solid polymers in which alkylene oxide units and carbon dioxide units alternate. Included in the patient's listing of exemplary epoxy compounds are ethylene oxide, propylene oxide, cyclohexene oxide, glycidyl methacrylate, vinylcyclohexene oxide, and mixtures of the listed compounds. The patent discloses separating the polymer product from the polymerization reaction mixture with dilute hydrochloric acid and then water washing the separated product. No utility of the polymers formed by the copolymerization is specifically alleged in the patent.

The U.S. Pat. No. 3,248,415 to Stevens discloses polymers having terminal hydroxyl groups and molecular weights of 700 to 5000, which are made by copolymerizing with a base catalyst a mixture of carbon dioxide, a 1,2 epoxide and a polyhydric alcohol. The structural formula for a typical polymer made with ethylene oxide as the 1,2 epoxide is disclosed as:

wherein m, n, o, etc., are positive whole integers of 1 or more, which can be the same or different. Similar polymers having average molecular weights between about 1,5000 and 30,000 are disclosed by the U.S. Pat. No. 4,500,704 to Kruper et al.

The U.S. Pat. Nos. 4,066,630, 4,104,264, 4,145,525 and 4,303,759 to Dixon et al., disclose normally solid poly (alkylene carbonates) apparently made by the process of the above Inoue et al. patent. These polymers are described as being of high molecular weight, such being about 50,000 to 500,000, with the polymer chains being hydroxy terminated. However, under the concepts of the invention of this specification, the number of polymer chains and thus the number of hydroxy groups available for reaction with compounds having substituents suitable for cross-linking are too few for the amount of cross-linking of polymer chains that needs to take place in photolithographic application.

As to the photolithographic aspect of the invention, a photoresist is a composition which is used by applying it to a substrate to form a thin (for example 0.5–1 $\mu$m thick) layer thereon, and subsequently exposing the latter in an imagewise fashion through a mask to molecular energizing radiation. Examples of such radiation include light, particularly ultraviolet light, and electrons, x-rays, ions and the like. The mask contains areas that block the passage of radiation through the mask, and areas through which radiation can pass. These areas define a pattern, for example, an electronic circuit pattern. The photoresist composition contains radiation sensitive material that chemically responds to the incident radiation reaching the resist layer to form a latent image of the mask pattern. The latent image is then "developed" by solvent or other treatment, depending on the kind of photoresist composition that is involved. The resist layer remaining on the substrate after development protects the underlying substrate during the additive, subtractive, or both, treatments of the areas of the substrate from which the resist layer was removed. If, for example, the underlying substrate is silicon dioxide, immersion of the structure in an etchant such as buffered hydrofluoric acid will result in selective etching of the substrate in those areas made bare by the development step.

One kind of photoresist composition comprises crosslinkable polymer material that is soluble in a development solvent, but, when cross-linked, becomes insoluble in that solvent. The polymer material contains functional groups that can be made to react to form cross-linked networks of polymer chains. The composition also comprises initiator material which, when exposed to the above described radiation, causes the functional groups to react as indicated. This invention relates to this kind of a photoresist composition.

A problem to which this invention provides a solution has to do with the removal of what remains of the photoresist layer from a substrate after the polymer material has been cross-linked, and the resist layer has served its purpose. One method to remove the layer is to thermally decompose it. However, most polymers heretofore in photoresists, when in cross-linked condition, have one or more or these disadvantages: they do not readily thermally decompose; they leave objectionable solid residues when they have decomposed; they emit toxic or odorous, or both, fumes as they thermally decompose. One or more of these disadvantages exist in the case of poly(methyl methacrylate), a polymer widely used in photoresist compositions. There is a need, therefore, for a photoresist composition in which the polymer material, when cross-linked, is readily thermally decomposed, leaves an insignificant, if any, amount of solid residue, and emits unobjectionable fumes as it thermally degrades.

SUMMARY OF THE INVENTION

The polymers aspect of this invention comprises a cross-linkable poly(alkylene carbonate) having substituents with trialkoxysilane moieties.

It also comprises a cross-linkable, normally viscous liquid, functionalized poly(alkylene carbonate) soluble at development temperatures, for example, 20–25° C., in solvents commonly used as developers in photolithography, such as, for example, methylene dichloride (more commonly referred to simply as methylene chloride), acetone, and the like, and, when cross-linked, insoluble therein. Some embodiments of this cross-linkable, normally viscous liquid, functionalized poly(alkylene carbonate) are water washable from substrates.

It further comprises cross-linked, functionalized poly(alkylene carbonate) that is insoluble in such photolithographic solvents as, for example, those mentioned above. Before becoming cross-linked, it is soluble in the solvent at those temperatures. The functionalized poly(alkylene carbonate), before becoming cross-linked, is characterized by substituents with terminal moieties selected from the group consisting of terminal alkenyl moieties and trialkoxysilane moieties.

The photolithographic aspect of this invention comprises a photoresist composition. It consists essentially of (a) polymer material consisting essentially of noncross-linked, cross-linkable, functionalized poly(alkylene carbonate), and (b) initiation material at a concentration effective to initiate cross-linking of said poly(alkylene carbonate) when activated.

It also comprises a photoresist composition consisting essentially of the above described cross-linked, functionalized poly(alkylene carbonate).

DETAILED DESCRIPTION OF THE INVENTION

In one embodiment of the functionalized poly(alkylene carbonate) the unsaturated substituents are pendant; that is, alkylene carbonate units between the ends of polymer chains have these substituents. In another embodiment these substituents are at the ends of polymer chains. In yet another embodiment these substituents are both pendant and at ends of polymer chains.

Preferred substituents are alkenyl, oxoalkenyl and oxocarbonylalkenyl with alkenyl in each of these moieties having 2–12 carbon atoms. Examples of such substituents include vinyl cyclohexenyl, allyloxo, acryloyl, propenylcarbonyloxo, and the like. In the trialkoxysilane moieties the alkyls have 1–6 carbons. Examples of a substituent with a trialkoxysilane moiety include propylene trimethoxy silane, ethylene trimethoxy silane, ethylene triethoxy silane, and the like.

The noncross-linked, pendant functionalized poly(alkylene carbonate) is made by the copolymerization of carbon dioxide and epoxide material consisting essentially of an epoxide with a substituent selected from the above group. The catalyst and polymerization conditions are the same as heretofore employed in the copolymerization of carbon dioxide and epoxides without functional substituents. Examples of an epoxide having a substituent with a terminal alkenyl moiety include vinyl cyclohexenyl oxide, allyl glycidyl ether, glycidyl acrylate, glycidyl methacrylate, and the like. An example of an epoxide with a substituent having a trialkoxysilane moiety is 3-glycidoxypropyl trimethoxy silane. In some embodiments the epoxide material comprises only one such substituted epoxide. In other embodiments it comprises more than one such substituted epoxide. In still other embodiments the epoxide material comprises one or more than one unsubstituted epoxide. Examples of an unsubstituted epoxide include ethylene oxide, propylene oxide, and cyclohexene oxide, which are readily commercially available.

A process for making noncross-linked, chain-end functionalized poly(alkylene carbonate) comprises catalytically reacting polyol material with normally solid poly(alkylene carbonate) material to form a normally liquid, hydroxy terminated poly(alkylene carbonate) product that then is reacted with alkenylacyl halide or alkenyl carboxylic acid to give a normally viscous liquid, noncross-linked, chain end functionalized poly(alkylene carbonate) product that becomes normally solid when cross-linked. Such a product is of particular advantage in photolithography.

The poly(alkylene carbonate) material consists essentially of a normally solid poly(alkylene carbonate). It can comprise more than one such polymer.

The polyol material consists essentially of a hydrocarbyl polyol. It can comprise more than one such polyol. Examples of a hydrocarbyl polyol include $C_2$–$C_{10}$ aliphatic polyols such as, for instance, ethylene glycol, glycerol, sorbitol, trimethylol propane, pentaerythritol, and the like. The quantity of polyol material is enough to provide at least two moles, preferably three moles, of hydroxyl per mole of poly(alkylene carbonate) material.

The reaction of polyol material with normally solid poly(alkylene carbonate) material is affected with catalyst material that consists essentially of a transesterification catalyst. In some embodiments of the process it comprises only one such catalyst. In others it comrises more than one such catalyst. Recommended are tin and zinc based organometallic compounds that function to catalyst the transesterification of polyesters. Compounds based on tin are preferred. Examples of such compounds include stannous octoate, dibutyltin dilaurate, and the like. Concentration of the catalyst material is generally 1–1000 ppm by weight of the poly(alkylene carbonate) material. The reaction can be carried out in a liquid medium such as a solvent for the poly(alkylene carbonate) material. However, it preferably is carried out without a solvent and at a temperature at which the normally solid poly(alkylene carbonate) material is molten. In such case a mixture of the normally solid poly(alkylene carbonate) material, polyol material and catalyst are established and maintained at such temperature until the reaction has reached substantial completion.

In the reaction of the normally liquid, hydroxy terminated poly(alkylene carbonate) product with alkenylacyl halide or alkenyl carboxylic acid, the quantity of alkenylacyl halide or alkenyl carboxylic acid is at least two moles per mole of hydroxyl groups in the product. Examples of the alkenylacyl halide include acryloyl chloride, methacryloyl chloride, methacrylic anhydride, and the like. Examples of the alkenyl carboxylic acid include acrylic acid, methacrylic acid, and the like. The reaction is performed by admixing the reactants at a temperature of 40–120° C. By-products, hydrogen halide and water are preferably removed during the reaction by purging with an inert gas or refluxing in a refluxing agent such as, for example, toluene.

In all of these embodiments of the noncross-linked functionalized poly(alkylene carbonate) of this invention, the content of the terminal alkenyl moieties and trialkoxysilane moieties in the polymer is at least that at which the desired extent of cross-linking takes place under cross-linking conditions. The desired extent is reflected by the polymer being insoluble in the development solvent at development temperatures. In general, the content of such units is about 5–100, preferably about 10–100, mole % of the functionalized poly(alkylene carbonate).

The polymerization reaction of carbon dioxide and the epoxide material is carried out with a polymerization catalyst. Preferred is a zinc catalyst such as diethyl zinc, disclosed in the U.S. Pat. No. 3,585,168 to Inoue et al., the diethyl zinc compounds disclosed in the U.S. Pat. No. 3,900,424 to Inoue et al., and the solid, zinc dicarboxylates of the U.S. Pat. No. 5,026,676 to Motika et al. The polymerization reaction conditions are generally those disclosed in these patents.

The functionalized poly(alkylene carbonate) is cross-linked by a procedure that is dependent upon the terminal moieties of the substituents of the substituted alkylene carbonate units.

When the substituents have terminal alkenyl moieties, cross-linking is affected by a process in which initiator material, and molecular energizing radiation or heat are used. This material consists essentially of a compound that generates free radicals when energized by heat or such radiation as x-rays, electrons, light, particularly ultraviolet light, and the like. The amount of initiator material is generally such as to provide, when energized, about 0.01–1 mole of free radicals per mole of substituted alkylene carbonate units.

In one general embodiment of the cross-linking process, the functionalized poly(alkylene carbonate) and the initiator material are admixed. If the functionalized poly(alkylene carbonate) is normally solid, this is done in a mutual solvent inert relative thereto. If the functionalized poly(alkylene carbonate) is normally liquid, and the initiator material is soluble therein, the mutual solvent need not, but can, be used. In any event, the resulting solution is applied to a substrate, the solvent is evaporated to leave on the substrate a coating of intimate mixture or blend of the uncross-linked, functionalized poly(alkylene carbonate) and initiator material. The coating then is treated to cause the initiator to generate free radicals. In one specific embodiment, the coating is exposed to ultraviolet light for a period of time sufficient for the desired extent of cross-linking to occur. In another specific embodiment, the coating is heated to a range of temperatures at which the initiator material generates free radicals, but which temperatures are less than the temperature at which a substantial portion of the polymer loses melt strength to the extent it begins to flow, unless such flow can be tolerated or is desired, but in any event less than the temperature at which significant thermal decomposition of the polymer begins. The coating is maintained in this temperature range until the desired extent of cross-linking occurs.

Another general embodiment of the cross-linking process involves not only the functionalized poly(alkylene carbonate) and the initiator material, but also multifunctional mercaptan material. The latter material consists essentially of a multifunctional mercaptan compound such as, for example, a compound of the formula $R(SH)_3$. An example of a multifunctional mercaptan compound is trimethylolpropane tris(3-mercaptopropionate). In this embodiment the multifunctional mercaptan molecules become the cross-links, whereby the cross-linked, functionalized poly(alkylene carbonate) product is an indirectly cross-linked, functionalized poly(alkylene carbonate) product. In contrast, the cross-linked, functionalized poly(alkylene carbonate) product of the above first described general embodiment of the cross-linking process is a directly cross-linked, functionalized poly(alkylene carbonate) product. In the mercaptan process embodiment of the quantity of multifunctional mercaptan material admixed with the functionalized poly(alkylene carbonate) is about 0.1–1 mole per mole of substituted alkyelene carbonate units. The cross-linking step in this embodiment is affected with light or heat.

When the substituents have terminal trialkoxysilane moieties, cross-linking is affected thermally. For example, the functionalized poly(alkylene carbonate) is dissolved in a solvent inert relative thereto, the resulting solution is applied to a substrate, the solvent is evaporated to leave a film of the functionalized poly(alkylene carbonate), and the film is heated to a range of temperatures at which cross-linking takes place, but which temperatures are less than the temperature at which a substantial portion of the polymer loses melt strength to the extent it begins to flow, unless such flow can be tolerated or is desired, but in any event less than the temperature at which significant thermal decomposition of the polymer begins. The film is maintained in that range until the desired extent of cross-linking occurs.

The cross-linked, functionalized poly(alkylene carbonate) is insoluble at 20–25° C. in such solvents as methylene chloride, acetone, methylethylketone, and the like. It adheres well to substrates subjected to photolithographic procedures. It is relatively unaffected by etchants used in photolithography. It is largely decomposed at temperatures above 300° C., but below 400° C., which temperatures are tolerated by electronic circuit components made by photolithographic procedures. The residue of such decomposition is less than 5% by weight of the polymer. It can be formed in situ. For example, after coating a surface with a solution of the noncross-linked, functionalized poly(alkylene carbonate) and initiator material, and removal of the solvent by evaporation, the coating thus formed is exposed to molecular energizing radiation. Another example: a molten blend of the noncross-linked, functionalized poly(alkylene carbonate) and initiator material, which blend is at a temperature at which the initiator material does not generate free radicals to a significant extent, is applied as by thermal extrusion to a surface, and then either radiated with molecular energizing radiation, or elevated in temperature to that at which enough free radicals are generated to cause cross-linking. Hence, the cross-linked, functionalized poly(alkylene carbonate) of this invention, considered broadly, is useful as a protective coating for articles, and particularly as a protective, thermally removable, sacrificial coating for surfaces of articles that need to be protected during part or all of their manufacture. More particularly, the cross-linked, functionalized poly(alkylene carbonate) of this invention is useful in photolithographic procedures as part or all of a negative resist layer on a substrate.

The polymer material in some embodiments of the composition of this invention comprises only one noncrosslinked, functionalized poly(alkylene carbonate). In other embodiments, it comprises more than one such poly(alkylene carbonate).

As indicated above, the initiator material of the composition of this invention, when exposed to molecular energizing radiation, or when heated to an elevated temperature, causes the polymer material to cross-link. This is believed to occur by the material forming free radicals when interact with the terminal alkenyl groups of the functionalized poly(alkylene carbonate) component of the polymer material to cause cross-linking of polymer chains. The initiation material consists essentially of a compound that generates free radicals when at an elevated temperature, or when exposed to molecular energizing radiation. Examples of such a compound include benzoyl peroxide, diethoxyacetophenone, benzophenone, benzil, benzoin, dicumyl perooxide, and the like. In some embodiments the initiation material comprises only one such compound. In other embodiments it comprises two or more of these compounds.

An effective concentration of the initiation material is generally 0.01–1 mole per mole of the substituted alkylene carbonate units present in the polymer material of the composition of this invention, but higher and lower concentrations at which such material is effective are within the broader scope of this invention.

In addition to the above described polymer material and initiation material, the photoresist composition of this invention can comprise other components, including those heretofor present in compositions of this kind.

The composition of this invention is used by forming a thin layer of it on a substrate (for example, a layer of silica dioxide on silicon). This can be done by dissolving the composition in a volatile solvent therefor to form a preferably thixotropic solution, forming a layer of the solution on the substrate, and evaporating the solvent from the layer of solution. After a photo mask with the desired, radiation-passing pattern thereon is placed over the layer, the photo mask is radiated with an ionizing radiation until the polymer material in the portions of the resist layer exposed to the radiation has become cross-linked to the desired extent.

The best mode now contemplated of carrying out the invention is illustrated by the following working examples. The invention is not limited to these examples. In these examples all parts are by weight unless otherwise indicated.

EXAMPLE 1

This example illustrates a specific embodiment of the cross-linked, functionalized poly(alkylene carbonate) of this invention, and a specific embodiment of the photoresist composition of this invention.

The formulation of this composition is:

| Components | Parts By Weight |
| --- | --- |
| Poly(glycidyl methacrylate carbonate) | 100 |
| Diethoxyacetophenone | 2 |
| Methylene Chloride | 1000 |

The poly(glycidyl methacrylate carbonate) is made by admixing under anhydrous conditions in the methylene chloride at 85° C. and under $CO_2$ pressure maintained at about 25 kg/cm² (2.45 MPa) $CO_2$ and glycidyl methacrylate with a solid, zinc glutarate polymerization catalyst of the above cited U.S. Pat. No. 5,026,676, The quantity of catalyst employed is about 0.02–0.03 mole per mole of glycidyl methacrylate. The admixing is carried out until the polymerization reaction is substantially finished, which is about 21 hours. The desired polymer is separated from the reaction mixture, washed with acetic acid and water, and then dried.

The specific photoresist composition of the above formulation is made by admixing the components until the polymer material has dissolved in the methylene chloride.

The composition is used by applying it to a substrate to form a layer or coating, evaporating the methylene chloride until the coating is substantially free of it, overlaying the coating with a photomask with the desired, radiation passage pattern, and then shining a GE sunlamp (75 watts) on the photomask for 10 minutes. Thereafter, the photomask is removed, and the coating is washed with methylene chloride. Typically in this washing step, the unexposed portions of the layer are removed from the substrate, while the exposed portions remain on the substrate. The insolubility of the exposed portions is caused by cross-linking of the poly(glycidyl methacrylate carbonate). The further steps of the photolithographic procedure are performed with the areas of the substrate covered by the remaining, exposed portions of the coating being uneffected by the step or steps, except that, after the remaining, exposed portions of the coating have served their purpose, the article formed by the step or steps is established and maintained at about 400–500° C. until the remaining portions of the coating have thermally decomposed.

EXAMPLE 2

This example illustrates a specific embodiment of a normally viscous liquid, noncross-linked, chain-end functionalized poly(alkylene carbonate) of this invention, and how to make it.

125 parts of normally solid poly(alkylene carbonate) (Mw=190,000) in pellet form, 11.3 parts of glycerol, and 0.057 part of dibutyltin dilaurate are admixed in a resin kettle, and heated to 160–179° C. for three hours under constant mixing and $N_2$ flow. The resulting reaction mixture is a low viscosity liquid which by IR measurement typically has a propylene carbonate content of about 20% by weight. The temperature of the reaction mixture is lowered to 80° C., and vacuum is applied for six hours to remove propylene carbonate. The product thus obtained is allowed to cool to room temperature. At that temperature it is a viscous liquid, and the quantity of it typically is 110 parts. It consists essentially of poly(alkylene carbonate) triol.

105 parts of this triol product, 39 parts of acryloyl chloride (about 1.1 times the hydroxyl mole content of the triol) are admixed in a resin kettle for three hours at 55° C. under $N_2$ flow. The reaction mixture in the kettle is subjected for four hours to vacuum applied through an NaOH absorption bed and a dry ice trap, and then is held overnight in a vacuum oven at 60° C. and high vacuum. The kettle contents are cooled to room temperature. The product thus obtained, typically 125 parts, is a viscous liquid. A typical viscosity at 25° C. is 4,000 cps (4 Pa.s). The product consists essentially of normally viscous liquid poly(propylene carbonate) triacrylate.

EXAMPLE 3

This example illustrates another specific embodiment of the cross-linked, functionalized poly(alkylene carbonate) of this invention, and another specific embodiment of the photoresist composition of this invention.

The formulation of the specific composition is:

| Components | Parts By Weight |
| --- | --- |
| Poly(propylene carbonate) triacrylate | 100 |
| Diethoxyacetophenone | 3 |

The poly(propylene carbonate) triacrylate is made as in Example 2.

The composition is prepared by admixing the components at 20–25° C. It typically is a dissolved mixture.

A sample of this photoresist composition was made and applied to one side of a polyester film of 200μ thickness. The resulting sheet had a thickness of 500μ. Part of the coating was covered with black tape. The coated side of the sheet was irradiated by a 375 nm UV, 75 watt, lamp for 8 minutes.

The uncovered part of the coating became a flexible film that was insoluble in both methylene chloride and acetone (in each case it just swelled), while the covered part of the coating remained liquid, and dissolved in both methylene chloride and acetone. In this regard, in further testing of the uncovered part of the film, 20 ml of methylene chloride and 0.598 g of the uncovered part were admixed and held for 24 hours at 20–25° C. The resulting, methylene chloride extracted, cross-linked film appeared as a swollen gel. It weighed 1.67 g. It was placed in a vacuum oven at 50° C. until it reached constant weight which was 0.18 g.

Thermogravimetric analysis (TGA) (in air, 10° C.) of the methylene chloride extracted, cross-linked film showed that its onset decomposition temperature was 275° C., the end-of-decomposition temperature was 335° C., and there was a residue at 550° C. amounting to 2% by weight of the film.

Hence, this invention provides a useful, cross-linked, functionalized poly(alkylene carbonate).

Other features, embodiments and advantages will become readily apparent to those in the exercise of ordinary skill in the art after reading the foregoing disclosures. Such are within the spirit and scope of the invention as claimed unless expressly excluded by claim language.

The expression "consisting essentially of" as used in this specification excludes an unrecited substance at a concentration sufficient to substantially adversely affect the essential properties and characteristics of the composition of matter being defined, while permitting the presence of one, or more than one, unrecited substance at a concentration, or concentrations, insufficient to substantially adversely affect said essential properties and characteristics.

What is claimed is:

1. A poly(alkylene carbonate) having substituents with trialkoxysilane moieties.

2. A cross-linked, functionalized poly(alkylene carbonate) that is insoluble in methylene chloride at 20–25° C., and that, before becoming cross-linked, comprised alkylene carbonate units having substituents with terminal moieties selected from the group consisting of terminal alkenyl moieties and trialkoxysilane moieties.

3. The poly(alkylene carbonate) of claim 2 in which said substituents are pendant.

4. The poly(alkylene carbonate) of claim 2 in which said substituents are at the ends of chains of the poly(alkylene carbonate).

5. The poly(alkylene carbonate) of claim 2 in which said terminal alkenyl moieties are selected from the group consisting of alkenyl, oxoalkenyl and oxocarbonylalkenyl with alkenyl in each of these moieties having 2–2 carbon atoms.

6. A photoresist composition comprising (a) polymer material consisting essentially of noncross-linked poly(alkylene carbonate) that comprises alkylene carbonate units having substituents with terminal moieties selected from the group consisting of terminal alkenyl moieties and trialkoxysilane moieties, and (b) initiation material at a concentration effective when the initiation material is activated to initiate cross-linking of said poly(alkylene carbonate).

7. A normally viscous liquid, noncross-linked, poly(alkylene carbonate), chain ends of which have substituents with terminal alkenyl moieties, which poly(alkylene carbonate) becomes normally solid when cross-linked.

8. A process for making a normally liquid, hydroxy terminated poly(alkylene carbonate), which process comprises reacting with catalyst material consisting essentially of a transesterification catalyst (a) polyol material and (b) normally solid poly(alkylene carbonate) material, the quantity of polyol material being enough to provide at least two moles of hydroxyl per mole of poly(alkylene carbonate) material.

9. A process for making a normally viscous liquid, noncrosslinked, chain-end functionalized poly(alkylene carbonate) that becomes normally solid when cross-linked, which process comprises: reacting with catalyst material consisting essentially of a transesterification catalyst (a) polyol material and (b) normally solid poly(alkylene carbonate) material to form a normally liquid, hydroxy terminated poly(alkylene carbonate); the quantity of polyol material being enough to provide at least two moles of hydroxyl per mole of poly(alkylene carbonate) material, and reacting the hydroxy terminated poly(alkylene carbonate) with alkenylacyl halide or alkenyl carboxylic acid to give the desired, normally viscous liquid, noncross-linked, chain-end functionalized poly(alkylene carbonate).

10. In a photolithographic process in which a photoresist composition is applied to a substrate to form a resist layer thereon, said composition comprising (a) noncross-linked polymer material that cross-links when such is initiated by initiation material, and (b) initiation material at a concentration effective when it is activated by molecular energizing radiation to initiate cross-linking of said polymer material; the layer is exposed in an image-wise fashion through a mask to said radiation, said mask having areas that block the passage of said radiation through the mask to the layer, and other areas through which the radiation passes to the layer to thereby cause the exposed polymer material to cross-link, which areas together define a desired pattern; removing the noncross-linked polymer material from the layer with a solvent therefor but not for the cross-linked polymer material; and ultimately, after the remaining cross-linked polymer material has served its purpose, removing by thermal decomposition the cross-linked polymer material from said substrate; the improvement in which said polymer material prior to exposure of said layer to said radiation consists essentially of noncross-linked, poly(alkylene carbonate) that is soluble in methylene chloride at 20–25° C., but, when cross-linked, is insoluble in methylene chloride at 20–25° C., said poly(alkylene carbonate) consisting essentially of alkylene carbonate units with substituents having terminal moieties selected from the group consisting of terminal alkenyl moieties and trialkoxysilane moieties.

11. A process according to claim 10 in which said terminal alkenyl moieties are selected from the group consisting of alkenyl, oxoalkenyl and oxocarbonylalkenyl with alkenyl in each of these moieties having 2–12 carbon atoms.

12. A process according to claim 8 in which said polyol material consists essentially of glycerol.

13. A process according to claim 9 in which said polyol material consists essentially of glycerol, and said hydroxy terminated poly(alkylene carbonate) is reacted with acryloyl chloride.

14. A photoresist composition according to claim 6 in which said polymer material consists essentially of poly (glycidyl methacrylate carbonate).

15. A photoresist composition according to claim 6 in which said polymer material consists essentially of poly (propylene carbonate) triacrylate.

* * * * *

UNITED STATES PATENT AND TRADEMARK OFFICE
CERTIFICATE OF CORRECTION

PATENT NO.    : 6,248,860 B1
DATED         : June 19, 2001
INVENTOR(S)   : Joseph G. Sant'Angelo et al.

It is certified that error appears in the above-identified patent and that said Letters Patent is hereby corrected as shown below:

Title page,
Item [75], Inventors, "Vincent D. McGinnis, Delaware, OH (US)" is changed to
-- Vincent D. McGinniss, Delaware County, OH (US) --;
Item [22] "Filed:      Dec. 27, 1999" is deleted; and the following continuing data are added:
-- PCT Filed:      June 29, 1998
   PCT No.:        US98/13927
   371 Date:       December 27, 1999
   102(e) Date:    December 27, 1999
   PCT Pub No.:    WO 99/00444
   PCT Pub Date:   January 07, 1999 --

Column 1,
Line 26, "nomrally liquid" is changed to -- "normally liquid" --.

Signed and Sealed this

Twenty-third Day of December, 2003

JAMES E. ROGAN
*Director of the United States Patent and Trademark Office*